(12) United States Patent
Igarashi et al.

(10) Patent No.: US 11,316,097 B2
(45) Date of Patent: Apr. 26, 2022

(54) MEMORY DEVICE

(71) Applicant: KIOXIA CORPORATION, Tokyo (JP)

(72) Inventors: Taichi Igarashi, Nagoya Aichi (JP);
Tadaomi Daibou, Yokkaichi Mie (JP);
Junichi Ito, Yokohama Kanagawa (JP);
Tadashi Kai, Setagaya Tokyo (JP);
Shogo Itai, Kawasaki Kanagawa (JP);
Toshiyuki Enda, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/003,846

(22) Filed: Aug. 26, 2020

(65) Prior Publication Data
US 2021/0296568 A1   Sep. 23, 2021

(30) Foreign Application Priority Data

Mar. 17, 2020   (JP) .............................. JP2020-046752

(51) Int. Cl.
| | | |
|---|---|---|
| H01L 43/02 | (2006.01) | |
| H01L 27/22 | (2006.01) | |
| G11C 11/16 | (2006.01) | |
| G11C 11/34 | (2006.01) | |
| G11C 11/54 | (2006.01) | |
| H01L 43/10 | (2006.01) | |

(52) U.S. Cl.
CPC ............ *H01L 43/02* (2013.01); *G11C 11/161* (2013.01); *G11C 11/1659* (2013.01); *G11C 11/34* (2013.01); *G11C 11/54* (2013.01); *H01L 27/224* (2013.01); *H01L 43/10* (2013.01)

(58) Field of Classification Search
CPC ....... H01L 43/02; H01L 27/224; H01L 43/10; G11C 11/161; G11C 11/1659
USPC .................................................. 365/158, 173
See application file for complete search history.

(56) References Cited

U.S. PATENT DOCUMENTS

| | | | |
|---|---|---|---|
| 7,821,086 B2 | 10/2010 | Kajiyama | |
| 2007/0235710 A1 | 10/2007 | Matsuzaki et al. | |
| 2008/0035907 A1* | 2/2008 | Czubatyj | H01L 45/04 257/4 |
| 2009/0027955 A1* | 1/2009 | Koh | G11C 11/1675 365/163 |

(Continued)

FOREIGN PATENT DOCUMENTS

JP   2017059653 A   3/2017

*Primary Examiner* — Michael T Tran
(74) *Attorney, Agent, or Firm* — Kim & Stewart LLP (57) ABSTRACT

According to one embodiment, a memory device includes a first wiring extending in a first direction, and a second wiring extending in a second direction that intersects the first direction. A memory cell is between the first wiring and the second wiring and includes a resistive memory element and a switching element that are connected in series between the first wiring and the second wiring. An insulating region surrounds side surfaces of the memory cell. The insulating region includes a first insulating part adjacent to a side surface of the resistive memory element and a second insulating part adjacent to a side surface of the switching element. The second insulating part has a higher thermal conductivity than the first insulating part.

20 Claims, 8 Drawing Sheets

(56) References Cited

U.S. PATENT DOCUMENTS

| | | | |
|---|---|---|---|
| 2009/0159867 A1* | 6/2009 | Savransky | H01L 45/1683 257/3 |
| 2009/0230379 A1* | 9/2009 | Klostermann | H01L 43/08 257/5 |
| 2011/0198554 A1* | 8/2011 | Iijima | H01L 45/1293 257/2 |
| 2011/0281379 A1* | 11/2011 | Yang | H01L 21/02074 438/16 |
| 2012/0243307 A1* | 9/2012 | Takashima | H01L 27/2436 365/163 |
| 2012/0287697 A1* | 11/2012 | Hanzawa | H01L 27/2481 365/148 |
| 2013/0043455 A1* | 2/2013 | Bateman | H01L 27/249 257/5 |
| 2013/0223124 A1* | 8/2013 | Park | G11C 11/16 365/96 |
| 2014/0061576 A1* | 3/2014 | Toh | H01L 45/06 257/5 |
| 2014/0332749 A1* | 11/2014 | Yokoyama | H01L 21/845 257/4 |
| 2018/0254414 A1* | 9/2018 | Bernasconi | H01L 45/1253 |
| 2018/0277601 A1 | 9/2018 | Ahn et al. | |
| 2018/0375023 A1* | 12/2018 | Song | H01L 45/1683 |
| 2019/0165264 A1* | 5/2019 | Wu | H01L 45/1608 |
| 2019/0189691 A1* | 6/2019 | Lee | H01L 45/147 |
| 2019/0288032 A1* | 9/2019 | Furuhashi | G11C 11/1659 |
| 2020/0013951 A1* | 1/2020 | Wu | H01L 45/126 |
| 2020/0091422 A1* | 3/2020 | Giannopoulos | H01L 45/148 |
| 2020/0134419 A1* | 4/2020 | Manipatruni | H01F 10/329 |
| 2020/0395410 A1* | 12/2020 | Grobis | H01L 27/2463 |

\* cited by examiner

MEMORY DEVICE

CROSS-REFERENCE TO RELATED APPLICATION(S)

This application is based upon and claims the benefit of priority from Japanese Patent Application No. 2020-046752, filed Mar. 17, 2020, the entire contents of which are incorporated herein by reference.

FIELD

Embodiments described herein relate generally to a memory device.

BACKGROUND

A memory device in which a memory cell including a resistive memory element and a switching element is integrated on a semiconductor substrate has been proposed.

DETAILED DESCRIPTION

Embodiments relate to a memory device capable limiting the influence of heat generation at a switching element.

In general, according to one embodiment, a memory device includes a first wiring extending in a first direction and a second wiring extending in a second direction that intersects the first direction. A memory cell is between the first wiring and the second wiring and includes a resistive memory element and a switching element that are connected to each other in series between the first wiring and the second wiring. An insulating region surrounds side surfaces of the memory cell. The insulating region includes a first insulating part adjacent to a side surface of the resistive memory element and a second insulating part adjacent to a side surface of the switching element. The second insulating part has a higher thermal conductivity than the first insulating part.

Hereinafter, certain example embodiments will be described with reference to the drawings.

Figure 1:
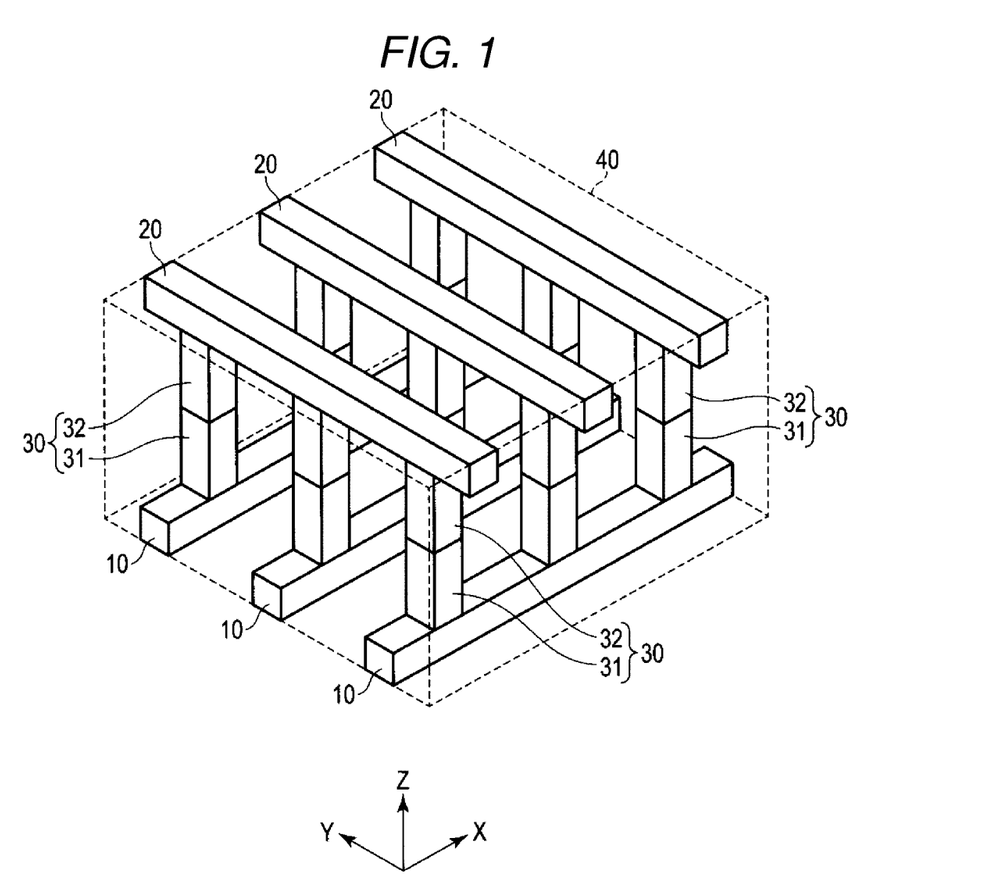
FIG. 1 is a view schematically illustrating a memory cell array region of a memory device according to an embodiment.
Figure 2:
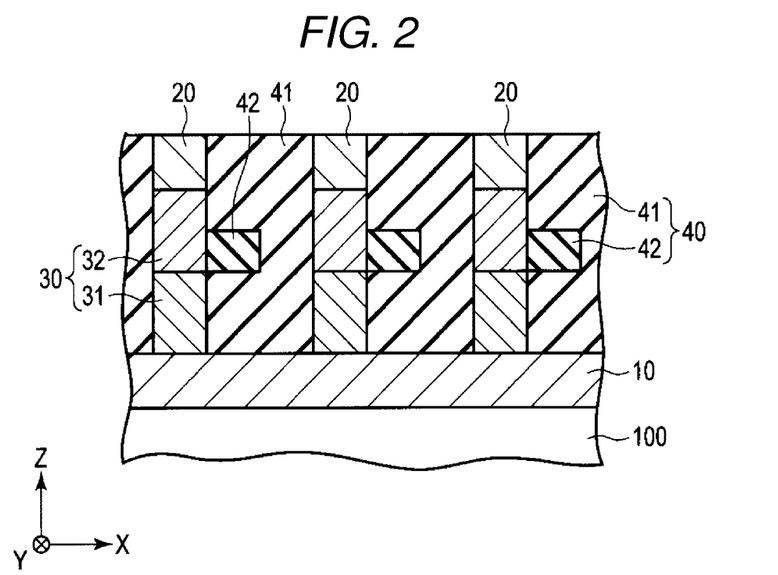
FIG. 2 is a cross-sectional view schematically illustrating a memory cell array region of a memory device according to an embodiment.
Figure 3:
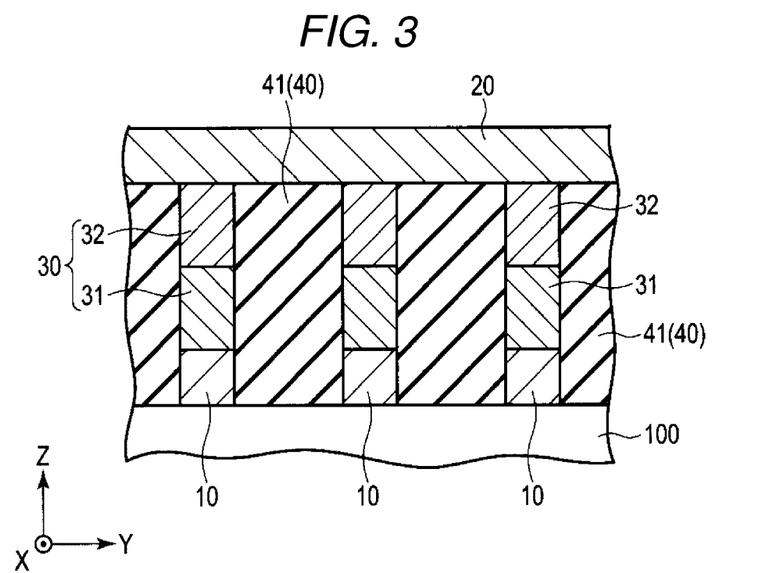
FIG. 3 is a cross-sectional view schematically illustrating a memory cell array region of a memory device according to an embodiment.

FIG. 1 is a view schematically illustrating a basic configuration of a memory cell array region of a memory device according to an embodiment. FIGS. 2 and 3 are each a cross-sectional view schematically illustrating the basic configuration of the memory cell array region of the memory device. FIG. 2 corresponds to a cross section in a direction parallel to an X direction in FIG. 1. FIG. 3 corresponds to a cross section in a direction parallel to a Y direction in FIG. 1.

As illustrated in FIGS. 2, and 3, the memory cell array region is provided on a lower part region 100. The lower part region 100 includes a semiconductor substrate, a transistor, a wiring, an interlayer insulating film, and the like. Specifically, the memory cell array region is integrated with transistors and the like on the semiconductor substrate. The lower part region 100 may also be referred to as a peripheral circuit region or the like.

The memory cell array region includes a plurality of first wirings 10, a plurality of second wirings 20, and a plurality of memory cells 30. The first wirings 10, the second wirings 20, and the memory cells 30 are surrounded by an insulating region 40.

The first wirings 10 intersect with the second wirings 20. Specifically, each of the first wirings 10 extends in the X direction, each of the second wirings 20 extends in the Y direction. The first wirings 10 intersect with the second wirings 20 when viewed in the Z direction, but are at different levels in the Z direction. The first wirings 10 correspond to either word lines or bit lines, and the second wirings 20 correspond to the other one of the word lines or the bit lines. In the embodiment, the first wirings 10 each correspond to a lower wiring, and the second wirings 20 each correspond to an upper wiring. However, in other examples, the first wirings 10 may each correspond to the upper wiring, and the second wirings 20 may each correspond to the lower wiring.

Each of the memory cells 30 is provided between a corresponding first wiring 10 and a corresponding second wiring 20. Each memory cell 30 includes a magnetoresistance effect element 31 (which is an example of a nonvolatile resistive memory element) and a selector 32 (which is an example of a two-terminal switching element) that are connected to each other in series between the corresponding first wiring 10 and the corresponding second wiring 20. In the present embodiment, the selector 32 is provided on the magnetoresistance effect element 31, the magnetoresistance effect element 31 is connected to the corresponding first wiring 10, and the selector 32 is connected to the corresponding second wiring 20.

A predetermined voltage can be applied across the first wiring 10 and the second wiring 20 connected to a target (selected) memory cell 30 to cause a current to flow through the target memory cell 30. In this manner, a write or read operation can be carried out for the target memory cell 30.

A side surface of each of the memory cells 30 is surrounded by (covered with) the insulating region 40. The insulating region 40 includes a first insulating part 41 adjacent to a side surface of the magnetoresistance effect element 31 and a second insulating part 42 adjacent to a side surface of the selector 32. The first insulating part 41 is in contact with at least a part of the side surface of the magnetoresistance effect element 31, and the second insulating part 42 is in contact with at least a part of the side surface of the selector 32. In the present embodiment, the second insulating part 42 is in contact with just apart of the side surface of the selector 32. The whole side surface of the magnetoresistance effect element 31 is surrounded by (covered with) the first insulating part 41, and the first insulating part is in contact with the whole side surface of the magnetoresistance effect element 31. In the present embodiment, the first insulating part 41 is in contact with a part of the side surface of the selector 32 that is not being contacted by the second insulating part 42.

The second insulating part 42 has higher thermal conductivity than that of the first insulating part 41. That is, the thermal conductivity of a material forming the second insulating part 42 is higher than that of a material forming the first insulating part 41. In the present embodiment, the first insulating part 41 is formed of silicon nitride (SiN), and the second insulating part 42 is formed of aluminum nitride (AlN). In other examples, the second insulating part 42 may be formed of silicon carbide (SiC).

Figure 4:
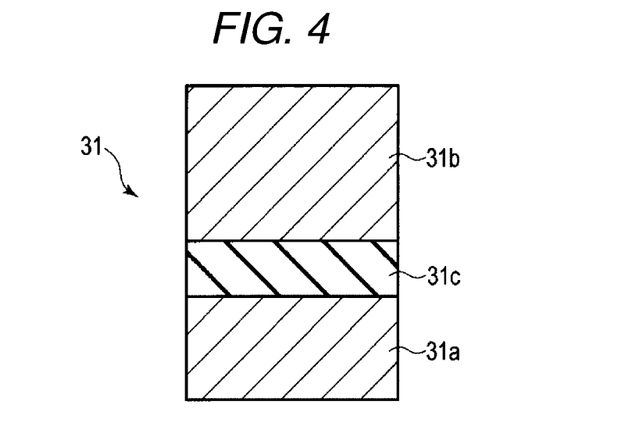
FIG. 4 is a cross-sectional view schematically illustrating a magnetoresistance effect element in a memory cell of a memory device according to an embodiment.

FIG. 4 is a cross-sectional view schematically illustrating a configuration of the magnetoresistance effect element 31 in each of the memory cells 30. While the present embodiment concerns a magnetoresistance effect element, in other embodiments other types of nonvolatile resistive memory elements that can be switched between a low resistance state and a high resistance state can be adopted. The magnetoresistance effect element in the present embodiment can also be referred to as magnetic tunnel junction (MTJ) element.

As illustrated in FIG. 4, the magnetoresistance effect element 31 includes a memory layer 31a (also referred to as a first magnetic layer), a reference layer 31b (also referred to a second magnetic layer), and a tunnel barrier layer 31c (also referred to as a non-magnetic layer). The tunnel barrier layer 31c is provided between the memory layer 31a and the reference layer 31b.

The memory layer 31a is a ferromagnetic layer having a variable magnetization direction. For example, the memory layer 31a is formed from a material containing iron (Fe), cobalt (Co), and boron (B). The reference layer 31b is a ferromagnetic layer having a fixed magnetization direction. For example, the reference layer 31b is formed from a layered structure including a layer formed from a material containing iron (Fe), cobalt (Co), and boron (B), and a layer formed from a material containing cobalt (Co) and another element selected from platinum (Pt), nickel (Ni), and palladium (Pd). The tunnel barrier layer 31c is a non-magnetic layer formed from an insulating material. For example, the tunnel barrier layer 31c is formed from a material containing magnesium (Mg) and oxygen (O). In this context, a variable magnetization direction means that the magnetization direction can be changed by application of a predetermined write current. A fixed magnetization direction means that the magnetization direction is not changed by application of the predetermined write current.

When the magnetization direction of the memory layer 31a is parallel to the magnetization direction of the reference layer 31b, the magnetoresistance effect element 31 is in a low resistance state. When the magnetization direction of the memory layer 31a is not parallel to the magnetization direction of the reference layer 31b, the magnetoresistance effect element 31 is in a high resistance state. Therefore, the magnetoresistance effect element 31 can store binary data according to its resistance state by being set to one of the low resistance state or high resistance state. The resistance state of the magnetoresistance effect element 31 can be set according to a direction of write current that flows into the magnetoresistance effect element 31. Depending on whether a current flows from the memory layer 31a into the reference layer 31b or from the reference layer 31b into the memory layer 31a, a different resistance state is set.

The example illustrated in FIG. 4 is a so-called "bottom free-type magnetoresistance effect element" in which the memory layer 31a is disposed on a lower layer side of the reference layer 31b. However, in other examples, "a top free-type magnetoresistance effect element" in which the memory layer 31a is disposed on an upper layer side of the reference layer 31b may be used. In the magnetoresistance effect element, a shift cancellation layer that blocks/shields a magnetic field that is otherwise applied to the memory layer 31a from the reference layer 31b may be further provided.

Figure 5:
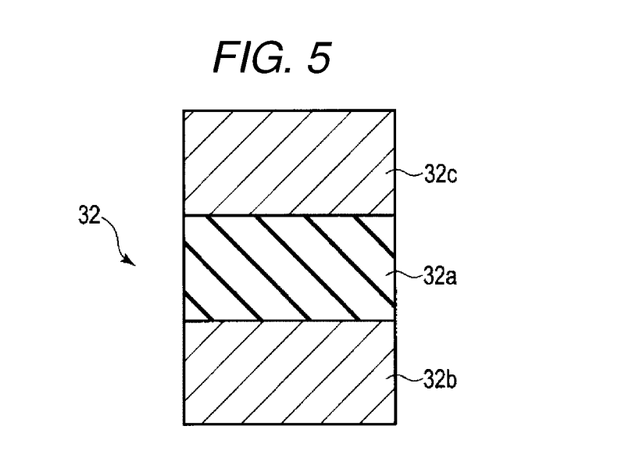
FIG. 5 is a cross-sectional view schematically illustrating a selector in a memory cell of a memory device according to an embodiment.

FIG. 5 is a cross-sectional view schematically illustrating a configuration of the selector 32 in each of the memory cells 30. The selector 32 has a configuration in which a selector material layer 32a is provided between a lower part electrode 32b and an upper part electrode 32c.

Figure 6:
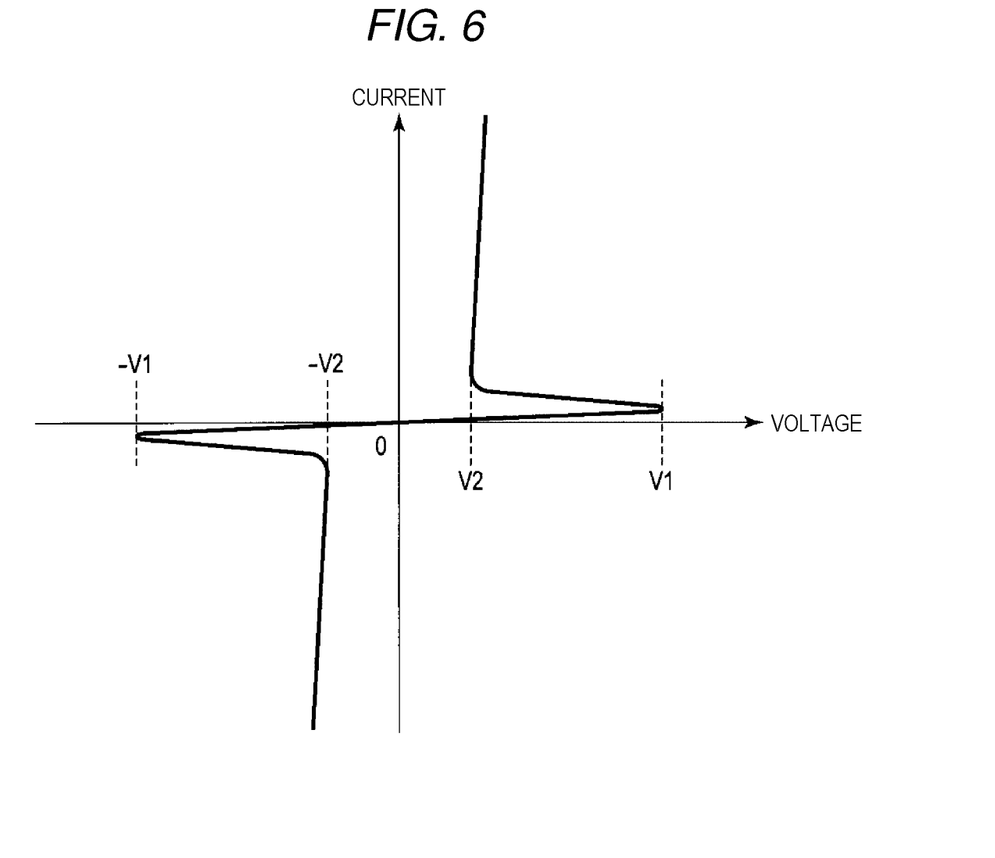
FIG. 6 is a graph schematically illustrating current-voltage (I-V) characteristics of a selector in a memory cell of a memory device according to an embodiment.

FIG. 6 is a view schematically illustrating current-voltage (I-V) characteristics of the selector 32 in each of the memory cells 30.

As illustrated in FIG. 6, when a voltage applied across the two terminals of the selector 32 is increased and reaches a first voltage V1 (referred to as an "on voltage"), the selector 32 is turned on from an OFF state. When the selector 32 is in the ON state and the voltage across the two terminals becomes a second voltage V2 (that is lower than the first voltage V1), current abruptly increases. When the voltage applied across the two terminals of the selector 32 is decreased to the second voltage V2 (off voltage), the selector 32 is turned off from the ON state. The selector 32 has current-voltage characteristics that are symmetric to both voltage polarity directions (forward and reverse directions).

When a predetermined voltage is applied across the first wirings 10 and the second wirings 20, a memory cell 30 is selected. As a result, the selector 32 in the selected memory cell 30 turns on to permit carrying out of the write or read operation for the magnetoresistance effect element 31 using a current that flows into the selected memory cell 30.

Figure 7:
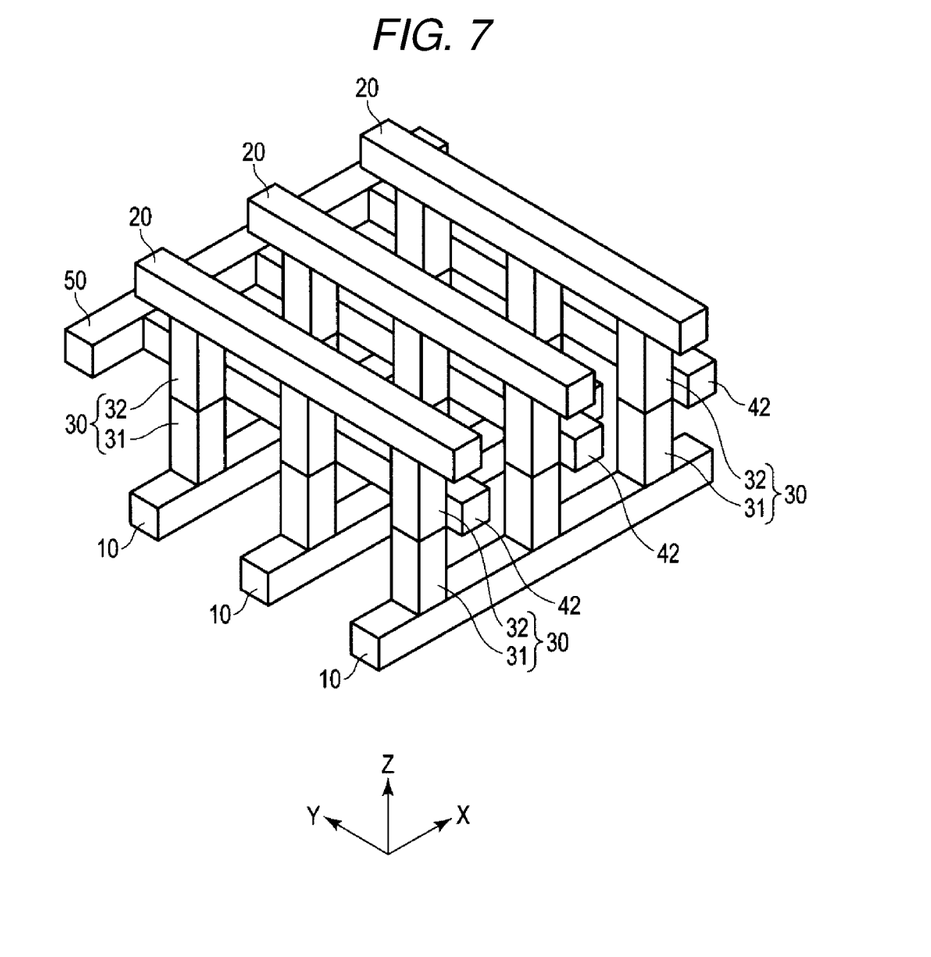
FIG. 7 is a view schematically illustrating one specific configuration of a memory cell array region of a memory device according to an embodiment.

FIG. 7 is a view schematically illustrating a specific configuration of a memory cell array region in the present embodiment. In FIG. 7, only the second insulating part 42 of the insulating region 40 is being shown for easier understanding the configuration. However, the first insulating part 41 is also provided where the second insulating part 42 is not provided.

As illustrated in FIG. 7, a second insulating part 42 continuously extends in the Y direction to contact with the side surface of each selector 32 in the memory cells 30 aligned in the Y direction. Each row of memory cells 32 along the Y direction is connected to the same insulating part 42. A heat sink part 50 extending in the X direction is connected to an end of the second insulating parts 42. The heat sink part 50 has higher thermal conductivity than that of the second insulating part 42.

In this embodiment, the insulating region 40 includes the first insulating part 41 and the second insulating part 42, which has higher thermal conductivity than that of the first insulating part 41. The second insulating part 42 is provided adjacent to the side surface of the selector 32. According to such a configuration, heat generated at the selector 32 can be more efficiently withdrawn by the second insulating part 42. Therefore, the influence of heat generation at the selector 32 can be reduced, and degradations in characteristics and reliability of the memory cells 30 can be prevented.

When in a memory device of the present embodiment, a predetermined voltage is applied across the first wirings 10 and the second wirings 20 as described above, the selectors 32 is turned on from the OFF state, to carry out the write or read operation for the magnetoresistance effect element 31 using a current that flows into each of the memory cells 30. When the selector 32 is turned on from the OFF state, Joule heat is generated by a current that flows into the selector 32, and the temperature of the selector 32 abruptly increases.

Figure 8:
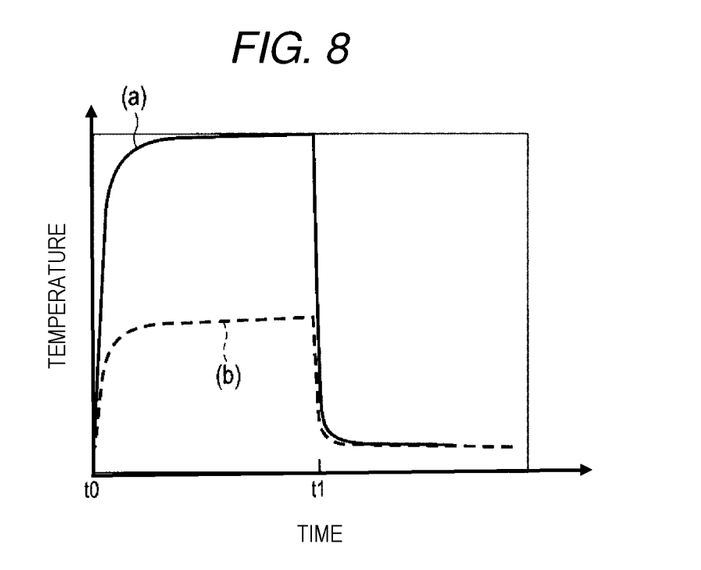
FIG. 8 is graph illustrating simulation results related to temperature variation of a memory cell when a selector is turned on from an OFF state.

FIG. 8 is a graph illustrating simulation results of temperature variation of the memory cells 30 occurring when the selector 32 is turned on from the OFF state. FIG. 8 shows the simulation results when the whole insulating region 40 is formed from a silicon nitride (that is, no distinct second insulating part 42 is provided). The horizontal axis represents time, and the vertical axis represents temperature. The profile "(a)" represents the temperature variation of the selector 32, and a profile "(b)" represents the temperature variation of the tunnel barrier layer in the magnetoresistance effect element 31. As illustrated in FIG. 8, the temperatures of the selector 32 and the magnetoresistance effect element 31 start to increase from a time point to, at which a voltage is applied to the memory cells 30, and continues to increase until a time point t1, at which the selector 32 completely reaches the ON state. At this time point t1, temperatures of the selector 32 and the magnetoresistance effect element 31 abruptly decrease since the selector 32 completely reaches the ON state.

When the selector 32 is turned on from the OFF state as described above, Joule heat is generated by a current that flows into the selector 32. Therefore, the characteristics and reliability of the selector 32 and the magnetoresistance effect element 31 may be degraded by the Joule heat generated at the selector 32 during this time.

In the present embodiment, the heat generated at the selector 32 can be efficiently withdrawn via the second insulating part 42, which has a relatively high thermal conductivity. Therefore, degradation in characteristics and reliability of the selector 32 and the magnetoresistance effect element 31 that might be caused by the heat generated at the selector 32 can be prevented.

Since the first insulating part 41 that has a relatively low thermal conductivity is adjacent to the side surface of the magnetoresistance effect element 31, heat conduction from the second insulating part 42 to the magnetoresistance effect element through the first insulating part 41 can be prevented. Accordingly, degradations in characteristics and reliability of the magnetoresistance effect element 31 that can be caused by the heat generated at the selector 32 can be prevented.

When the heat sink part 50, which has higher thermal conductivity than that of the second insulating part 42, is connected to the ends of the second insulating part 42 as illustrated in FIG. 7, heat can be more even efficiently radiated or otherwise removed. Therefore, degradations in characteristics and reliability of the memory cells 30 can be further prevented.

Figure 9:
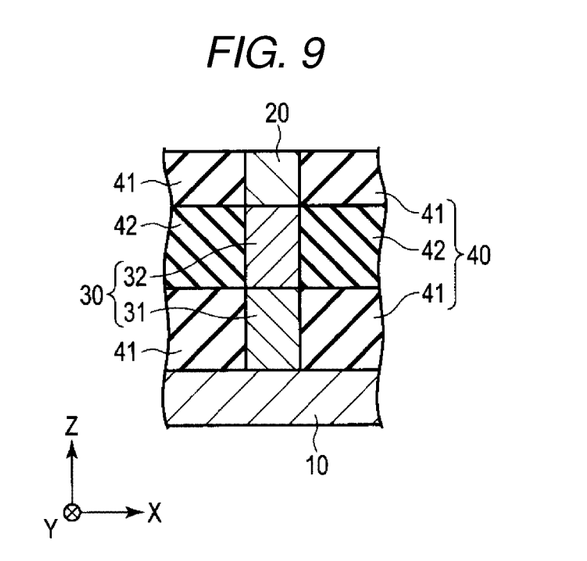
FIG. 9 is a cross-sectional view schematically illustrating a first modification of a memory cell array region of a memory device according to an embodiment.

FIG. 9 is a cross-sectional view schematically illustrating a configuration of a first modification of the memory cell array region of the memory device according to an embodiment. In this modification, the entire side surface of the selector 32 is surrounded by the second insulating part 42. Specifically, the whole side surface of the selector 32 is surrounded by (covered with) the second insulating part 42. The first insulating part 41 is provided at regions other than the second insulating part 42 in the insulating region 40. In the first modification, heat generated at the selector 32 can be efficiently relieved. Although not illustrated in FIG. 9, a heat sink 50 or the like may be connected to the second insulating part 42 in a manner similar to that depicted in FIG. 7.

Figure 10:
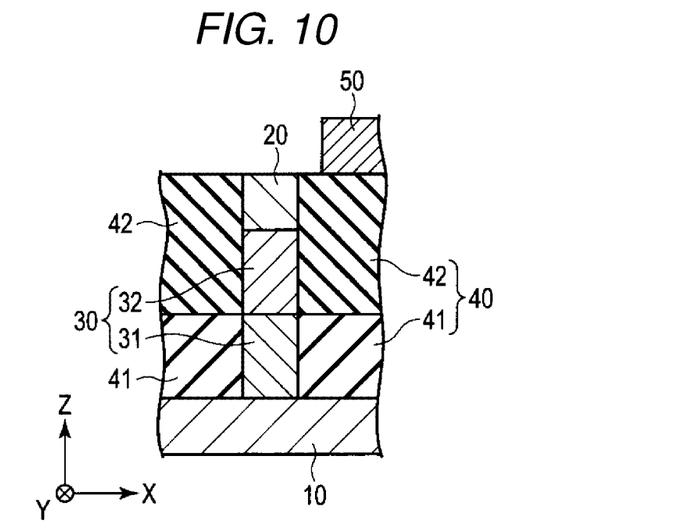
FIG. 10 is a cross-sectional view schematically illustrating a second modification of a memory cell array region of a memory device according to an embodiment.

FIG. 10 is a cross-sectional view schematically illustrating a configuration of a second modification of the memory cell array region of the memory device according to an embodiment. In this second modification, the second insulating part 42 includes apart that is disposed at a position higher than an upper end of the side surface of the selector 32. Specifically, the whole side surface of the selector 32 is surrounded by (covered with) the second insulating part 42, and also the whole side surface of the second wirings 20 is covered with the second insulating part 42. Since the second insulating part 42 includes the part that is disposed at a position higher than an upper end of the side surface of the selector 32, a heat sink 50 can be provided on an upper surface of the second insulating part 42. In the second modification, heat generated at the selector 32 can be efficiently relieved.

Figure 11:
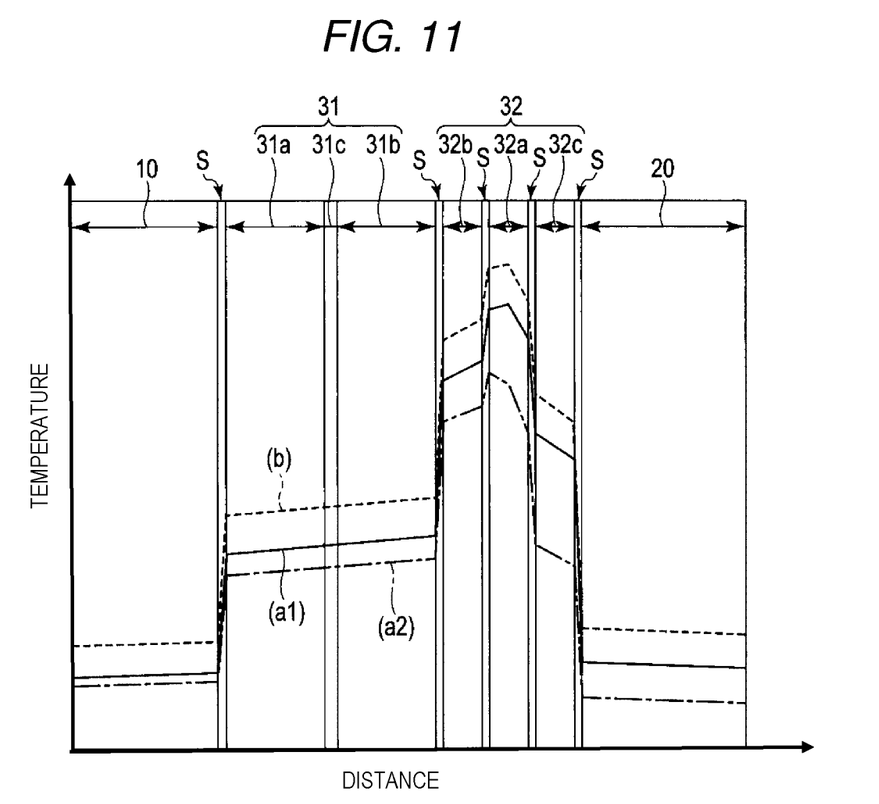
FIG. 11 is a view illustrating temperature distribution simulation results for a predetermined current flow into a memory cell of a memory device according to an embodiment.

FIG. 11 is a graph illustrating simulation results of the temperature distribution in the first wiring 10, the magnetoresistance effect element 31 (the memory layer 31*a*, the reference layer 31*b*, and the tunnel barrier layer 31*c*), the selector 32 (the selector material layer 32*a*, the lower part electrode 32*b*, and the upper part electrode 32*c*), and the second wiring 32 when a predetermined current flows into each of the memory cells 30. The horizontal axis represents distance from the upper surface of the first wiring 10, and the vertical axis represents temperature. A thin layer S that is indicated as being between different layers is a layer provided for consideration of interface thermal resistance. A profile "(a1)" is a temperature distribution profile when the configuration of the first modification of the embodiment (see FIG. 9) is used. A profile "(a2)" is a temperature distribution profile when the configuration of the second modification of the embodiment (see FIG. 10) is used. A profile "(b)" is a temperature distribution profile of a Comparative Example (in which the whole insulating region 40 is formed from a silicon nitride). It is seen in FIG. 11 that increases in temperatures of the magnetoresistance effect element 31 and the selector 32 can be prevented as compared to the Comparative Example.

Figure 12:
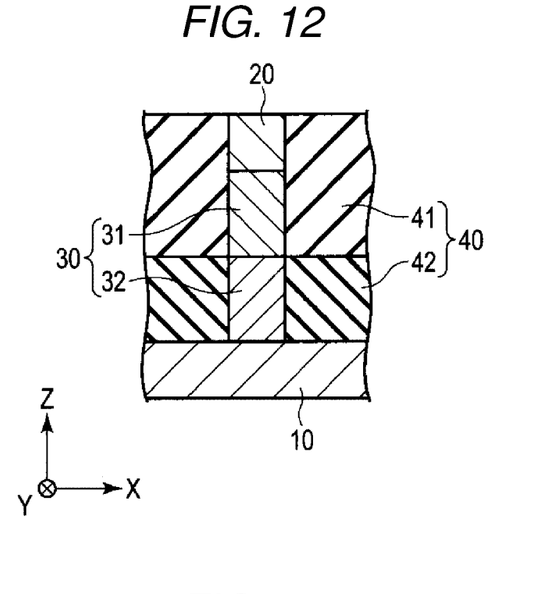
FIG. 12 is a cross-sectional view schematically illustrating a third modification of a memory cell array region of a memory device according to an embodiment.

FIG. 12 is a cross-sectional view schematically illustrating a configuration of a third modification of the memory cell array region of the memory device according to an embodiment. In the first and second modifications of the embodiment, the selector 32 is provided on the upper layer side of the magnetoresistance effect element 31. In this third modification, the selector 32 is provided on a lower layer side of the magnetoresistance effect element 31. Even when the selector 32 is provided on the lower layer side of the magnetoresistance effect element 31, heat generated at the selector 32 can still be efficiently relieved by the second insulating part 42 provided adjacent to the side surface of the selector 32. Although not illustrated in FIG. 12, a heat sink 50 or the like may be connected to the second insulating part 42.

Figure 13:
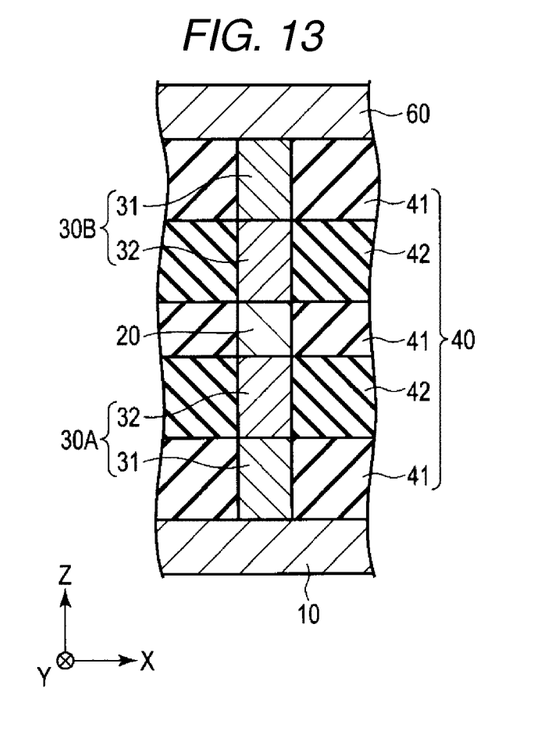
FIG. 13 is a cross-sectional view schematically illustrating a fourth modification of a memory cell array region of a memory device according to an embodiment.

FIG. 13 is a cross-sectional view schematically illustrating a configuration of a fourth modification of the memory cell array region of the memory device according to an embodiment. In this fourth modification, a memory cell 30B is further provided on an upper layer side of a memory cell 30A. The memory cell 30A is provided between the first wiring 10 and the second wiring 20, and the memory cell 30B is provided between the second wiring 20 and a third wiring 60. A basic configuration of the magnetoresistance effect element 31 and the selector 32 in the memory cell 30B is the same as a basic configuration of the magnetoresistance effect element 31 and the selector 32 in the memory cell 30A.

Similarly to first embodiment and the first to third modifications, a side surface of the memory cell 30A and a side surface of the memory cell 30B are surrounded by (covered with) the insulating region 40, and the second insulating part 42 is provided adjacent to the side surface of the selector 32 in both the memory cells 30A and 30B. A heat sink 50 or the like may be connected to the second insulating part (s) 42. One or more memory cells may be further provided on an upper layer side of the memory cell 30B. Even when two or more memory cells are provided stacked in the Z direction, heat generated at the selector 32 can be efficiently relieved by the second insulating part 42 being provided adjacent to the side surface of the selector 32.

In the above examples, a magnetoresistance effect element is used as one type of a resistive memory element that has a low resistance state and a high resistance state. However, in other examples, a resistive memory element other than a magnetoresistance effect element may be used.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A memory device, comprising:
   a first wiring extending in a first direction;
   a second wiring extending in a second direction that intersects the first direction;
   a memory cell between the first wiring and the second wiring, the memory cell including a resistive memory element and a switching element that are connected in series between the first wiring and the second wiring; and
   an insulating region surrounding side surfaces of the memory cell, wherein
   the insulating region includes a first insulating part contacting a side surface of the resistive memory element and a second insulating part contacting a side surface of the switching element, and
   the second insulating part has a thermal conductivity that is greater than that of the first insulating part.

2. The memory device according to claim 1, wherein the first insulating part surrounds the resistive memory element in a plane parallel to the first and second directions.

3. The memory device according to claim 1, wherein the second insulating part is adjacent to only one side surface of the switching element and does not contact the side surface of the resistive memory element.

4. The memory device according to claim 1, wherein the second insulating part surrounds the switching element in a plane parallel to the first and second directions and does not contact the side surface of the resistive memory element.

5. The memory device according to claim 1, wherein the second insulating part is adjacent to all side surfaces of the switching element.

6. The memory device according to claim 1, wherein
   the switching element is on an upper layer side of the resistive memory element, and
   the second insulating part includes a part that extends beyond an upper end of the side surface of the switching element.

7. The memory device according to claim 6, wherein the part that extends beyond the upper end of the side surface of the switching element is adjacent to a side surface of the second wiring.

8. The memory device according to claim 7, wherein the part that extends beyond the upper end of the side surface of the switching element is adjacent to all side surfaces of the second wiring.

9. The memory device according to claim 6, further comprising:
   a heat sink part on an upper surface of the second insulating part, the heat sink part having a thermal conductivity which is greater than the thermal conductivity of the second insulating part.

10. The memory device according to claim 1, further comprising:
    a heat sink part connected to an end surface of the second insulating part, the heat sink part having a thermal conductivity which is greater than the thermal conductivity of the second insulating part.

11. The memory device according to claim 1, wherein the first insulating part is silicon nitride.

12. The memory device according to claim 1, wherein the second insulating part is aluminum nitride or a silicon carbide.

13. The memory device according to claim 1, wherein the second insulating part is silicon carbide.

14. The memory device according to claim 1, wherein
    the first insulating part is silicon nitride, and
    the second insulating part is aluminum nitride or silicon carbide.

15. The memory device according to claim 1, wherein the resistive memory element is a magnetoresistance effect element.

16. The memory device according to claim 1, wherein,
    when a voltage applied across the terminals of the switching element increases to a first voltage, the switching element is turned on from an OFF state, and
    when the voltage applied across the terminals of the switching element decreases to a second voltage lower than the first voltage, the switching element is turned off from the ON state.

17. The memory device according to claim 1, wherein, when the switching element is turned on, a write or read operation can be carried out on the resistive memory element.

18. A memory device, comprising:
- a memory cell between a first wiring and a second wiring, the memory cell including a resistive memory element and a switching element stacked on each other in a first direction; and
- an insulating region surrounding side surfaces of the memory cell, wherein
- the insulating region includes a first insulating material contacting a side surface of the resistive memory element and a second insulating material contacting a side surface of the switching element but not contacting the side surface of the resistive memory element, and
- the second insulating material has a thermal conductivity that is greater than that of the first insulating material.

19. The memory device according to claim 18, wherein
- the first insulating material surrounds all side surfaces of the resistive memory element, and
- the second insulating material surrounds all side surfaces of the switching element.

20. The memory device according to claim 18, further comprising:
- a heat sink part connected to the second insulating material, the heat sink part having a thermal conductivity which is greater than the thermal conductivity of the second insulating material.

\* \* \* \* \*